(12) United States Patent
Packard, III et al.

(10) Patent No.: US 9,397,413 B2
(45) Date of Patent: Jul. 19, 2016

(54) NEUTRAL-GROUND SUBASSEMBLY FOR ELECTRIC METER ASSEMBLY

(71) Applicant: Cooper Technologies Company, Houston, TX (US)

(72) Inventors: Duan E. Packard, III, Sherman, TX (US); Daniel Wayne Vosbrink, Collinsville, IL (US)

(73) Assignee: Cooper Technologies Company, Houston, TX (US)

( * ) Notice: Subject to any disclaimer, the term of this patent is extended or adjusted under 35 U.S.C. 154(b) by 2 days.

(21) Appl. No.: 14/160,151

(22) Filed: Jan. 21, 2014

(65) Prior Publication Data

US 2015/0207282 A1  Jul. 23, 2015

(51) Int. Cl.
*H01R 4/66* (2006.01)
*H01R 4/28* (2006.01)
*G01R 11/04* (2006.01)

(52) U.S. Cl.
CPC *H01R 4/28* (2013.01); *G01R 11/04* (2013.01); *Y10T 29/49208* (2015.01)

(58) Field of Classification Search
CPC ....... H01R 4/64; H01R 9/0524; H01R 13/426
USPC ............... 439/95, 146, 517, 744–746, 97, 98, 439/101; 174/51; 361/668
See application file for complete search history.

(56) References Cited

U.S. PATENT DOCUMENTS

| | | |
|---|---|---|
| 2,931,879 A | 4/1960 | Waldrop |
| 3,131,984 A | 5/1964 | Kobryner |
| 3,221,216 A | 11/1965 | Kobryner |
| 3,394,340 A | 7/1968 | Kobryner |
| 3,628,097 A | 12/1971 | Kobryner |
| 3,731,253 A | 5/1973 | Coffey |
| 3,735,332 A | 5/1973 | Tirrell |
| 4,104,588 A | 8/1978 | Westberry |
| 4,690,483 A | 9/1987 | Carris |
| 5,774,317 A | 6/1998 | Allina |
| 6,549,388 B2 | 4/2003 | Robinson |
| 6,561,844 B1 | 5/2003 | Johnson |
| 6,592,399 B2 | 7/2003 | Robinson et al. |
| 6,931,893 B2 | 8/2005 | Agbay |
| 7,142,412 B2 | 11/2006 | Witherbee et al. |
| 7,291,042 B2 | 11/2007 | Johnson |
| 7,503,800 B2 | 3/2009 | Siglock et al. |

(Continued)

FOREIGN PATENT DOCUMENTS

WO  2012112975 A3  8/2012

OTHER PUBLICATIONS

Malbank, Isolated Neutral Kits, Aug. 2012, 4 pages, Kansas City, Missouri.

*Primary Examiner* — Neil Abrams
*Assistant Examiner* — Travis Chambers
(74) *Attorney, Agent, or Firm* — Senniger Powers LLP

(57) ABSTRACT

An electric meter socket assembly includes a neutral-ground support and a neutral-ground terminal. The neutral-ground support includes a support body having a mounting surface and a support connector at the mounting surface of the body. The neutral-ground terminal includes a terminal body having a rear, an opening for receiving a neutral conductor, and a terminal connector at the rear of the terminal body configured to mate with the support connector such that the neutral-ground terminal is attachable to the neutral-ground support without use of a separate fastener.

20 Claims, 11 Drawing Sheets

FIG. 10

(56) References Cited

U.S. PATENT DOCUMENTS

| | | |
|---|---|---|
| 7,559,793 B1 | 7/2009 | Zhang et al. |
| 7,614,908 B2 | 11/2009 | Zhang |
| 7,621,775 B1 | 11/2009 | Michaud et al. |
| 7,850,483 B2 | 12/2010 | Siglock et al. |
| 8,040,664 B2 | 10/2011 | Makinson et al. |
| 8,218,295 B1 * | 7/2012 | Shoemaker et al. .......... 361/668 |
| 8,602,814 B2 | 12/2013 | Packard, III et al. |
| 2001/0021605 A1 | 9/2001 | Bolam |
| 2009/0247005 A1 | 10/2009 | Zhang et al. |
| 2010/0203748 A1 * | 8/2010 | Wason et al. ................... 439/98 |
| 2010/0323555 A1 | 12/2010 | Geiger et al. |
| 2012/0214334 A1 * | 8/2012 | Packard et al. ............... 439/517 |
| 2014/0038452 A1 * | 2/2014 | Zhang .......................... 439/517 |

\* cited by examiner

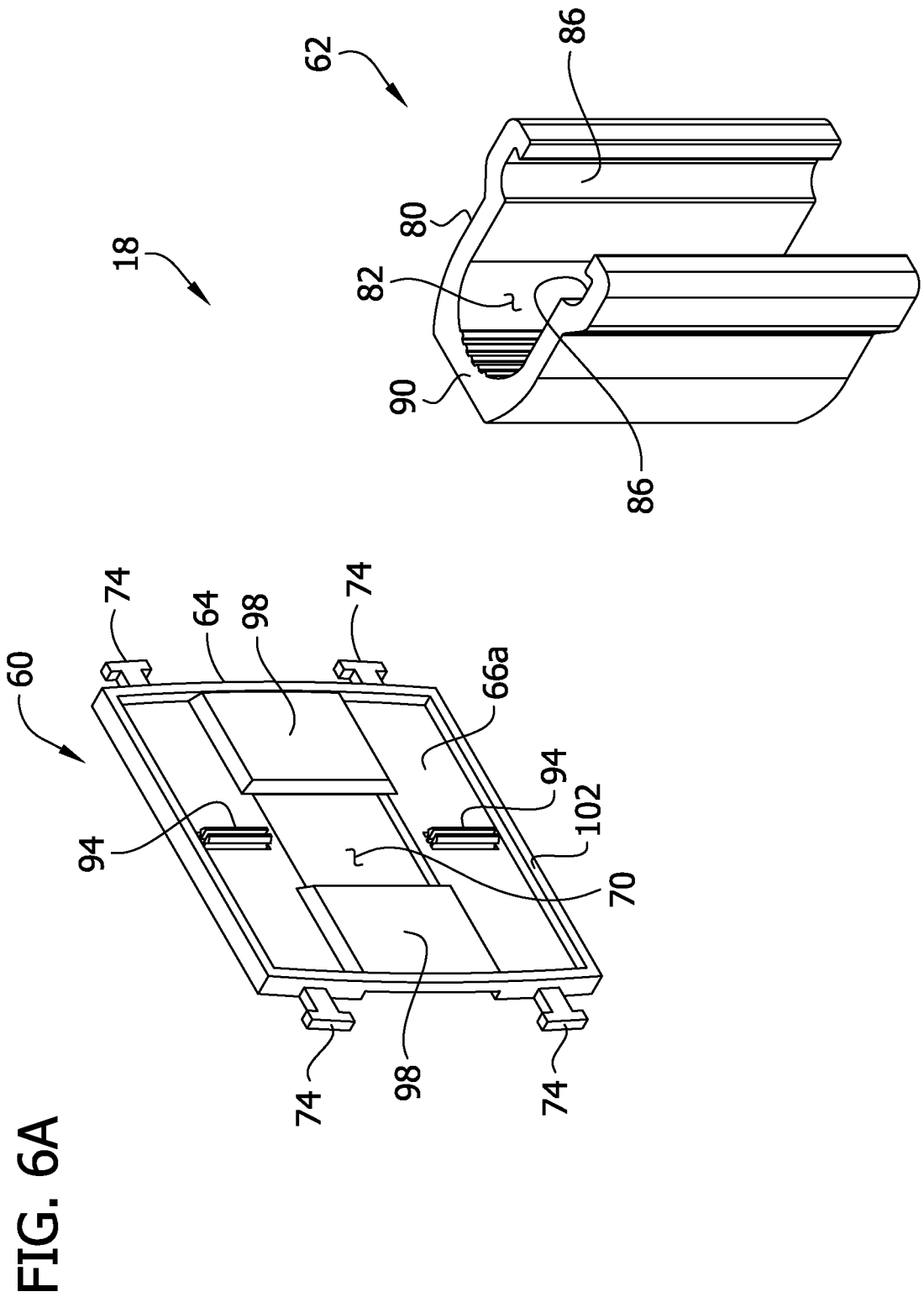

NEUTRAL-GROUND SUBASSEMBLY FOR ELECTRIC METER ASSEMBLY

FIELD OF THE DISCLOSURE

The present disclosure generally relates to a neutral-ground subassembly for an electric meter assembly.

BACKGROUND OF THE DISCLOSURE

Meters are used to measure electricity usage. For example, a meter may be connected to power lines entering a building to measure electricity usage in the building. An electric meter socket assembly is mounted on the building to connect the meter to the power lines. The meter socket assembly includes a meter socket subassembly secured within an enclosure. The meter socket subassembly includes terminals to which the power lines are electrically connected, and jaw contacts corresponding to the respective terminals for receiving blade connectors extending from the electric meter. The terminals and the jaw contacts are mounted on an electrically non-conductive base, which is in turn secured to a back wall of an enclosure of the electric meter socket assembly. The meter socket assembly also includes a neutral-ground terminal to which a neutral line is connected. In certain electrical codes, the neutral-ground terminal must be grounded to ground the neutral line, while in other electrical codes, the neutral-ground can/should be ungrounded.

SUMMARY OF THE DISCLOSURE

In one aspect, an electric meter socket assembly generally comprises a neutral-ground support and a neutral-ground terminal. The neutral-ground support includes a support body having a mounting surface, and a support connector at the mounting surface of the body. The neutral-ground terminal includes a terminal body having a rear, and an opening for receiving a neutral conductor, and a terminal connector at the rear of the terminal body configured to mate with the support connector such that the neutral-ground terminal is attachable to the neutral-ground support without use of a separate fastener.

In another aspect, an electric meter socket assembly generally comprises a neutral-ground terminal and a neutral-ground support. The neutral-ground terminal includes a terminal body having a rear, a neutral conductor opening for receiving a neutral conductor, and a first lead conductor opening extending through the terminal body. The neutral-ground support includes a support body having a terminal mounting surface, and a second lead conductor opening extending through the support body. The neutral-ground terminal is mounted on the support body. At least a portion of the neutral-ground support is electrically non-conductive such that the neutral-ground support electrically isolates the neutral-ground terminal to selectively inhibit electrical connection of the neutral-ground terminal to ground. The first and second lead conductor openings are generally aligned and configured to receive a lead conductor therethrough for selectively electrically connecting the neutral-ground terminal to ground.

In yet another aspect, a method of assembling an electric meter socket assembly generally comprises providing a neutral-ground support including a support body having a front mounting surface, and a support connector at the mounting surface of the support body. A neutral-ground terminal including a terminal body having a rear, and a terminal connector at the rear of the terminal body configured to mate with the support connector is provided. The terminal connector is mated with the support connector to attach the neutral-ground terminal to the neutral-ground support without use of a separate fastener.

Other features will be in part apparent and in part pointed out hereinafter.

BRIEF DESCRIPTION OF THE DRAWINGS

FIG. 6A is an exploded front perspective of the neutral-ground subassembly;

Corresponding reference characters indicate corresponding parts throughout the drawings.

DETAILED DESCRIPTION OF THE DRAWINGS

Figure 1:
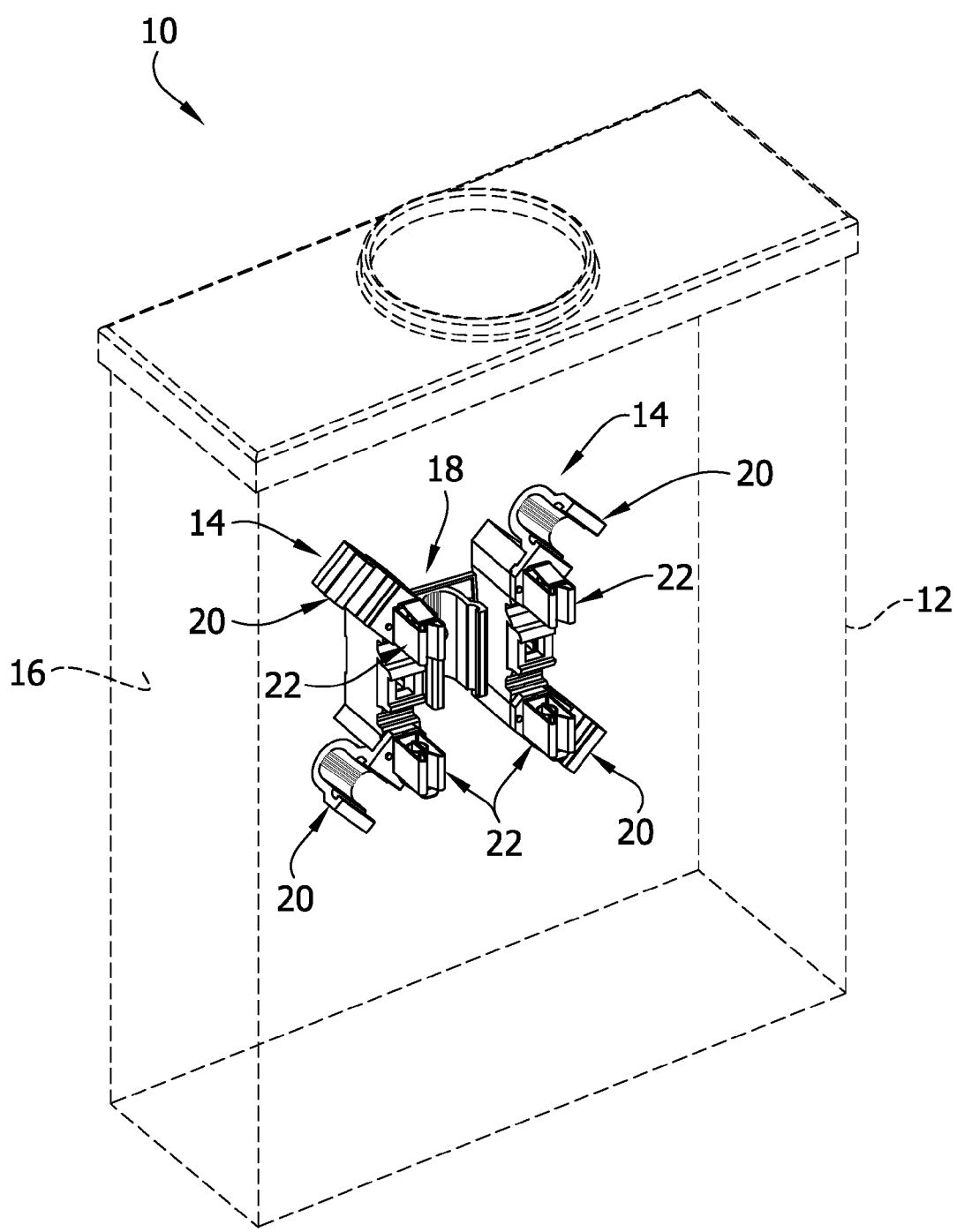
FIG. 1 is a perspective of a meter socket assembly, an enclosure of the meter socket assembly shown in broken lines for illustrative purposes.

Referring to FIG. 1, one embodiment of an electric meter socket assembly is generally indicated at reference numeral 10. The illustrated meter socket assembly 10 includes an enclosure 12, two spaced apart meter socket subassemblies, each generally indicated at 14, secured to a back wall 16 within the enclosure, and a neutral-ground subassembly, generally indicated at 18, connected to and extending between the two meter socket subassemblies. Each meter socket subassembly 14 includes a plurality of (e.g., two) electrically-conductive power line terminals, each indicated generally at reference numeral 20, and a plurality of (e.g., two) electrically-conductive female electrical contacts, each indicated generally at reference numeral 22.

Figure 2:
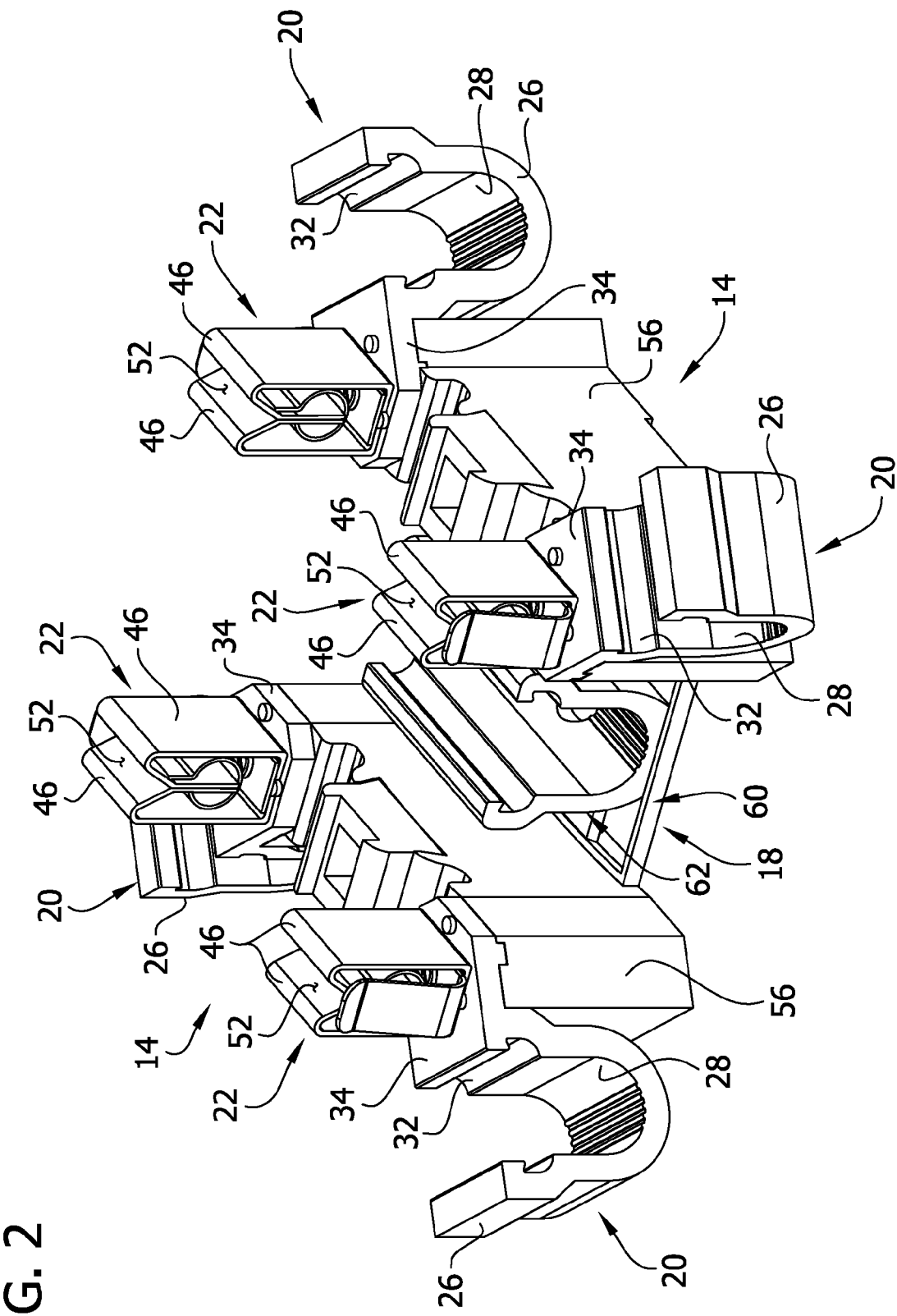
FIG. 2 is a perspective of two meter socket subassemblies and a neutral-ground subassembly of the meter socket assembly shown in a different orientation than in FIG. 1.

Referring to FIG. 2, each power line terminal 20 is configured for electrical connection to a power line, and each female electrical contact 22 is electrically connected to one of the power line terminals and configured to receive a male electrical contact (e.g., a blade contact, not shown) extending from the electric meter (not shown). For example, in the illustrated embodiment each power line terminal 20 includes a generally U-shaped terminal body 26 defining a channel 28 (or other opening), a cap (not shown) slidably received in a track 32 defined by a front portion of the body, and a mounting member 34 extending laterally outward from the body adjacent the front portion of the body. Each power line (not shown) is securable in the channel 28 of the corresponding terminal body 26 using a fastener (e.g., set screw; not shown) threaded in the cap to both electrically and mechanically connect the power line to the terminal body 26. It is understood that the power line terminals 20 may be of other configurations and types, without departing from the scope of the present disclosure.

Also, in the illustrated embodiment, each female electrical contact 22 includes, opposing jaws 46 defining a slot 52 at a front of the female electrical contact 22. The blades (not shown) of the meter (not shown) are insertable into the respective slots 52 to electrically connect the meter to the female electrical contact 22. In the illustrated embodiment, the female electrical contact 22 is formed from a single, integral sheet of metal that is bent to form the jaws 46. The power line terminals 20 and the female electrical contacts 22 are mounted on front portions of respective electrically non-conductive bases 56, which are, in turn, secured to (e.g., fastened using a fastener) the back wall 16 of the enclosure 12.

Figure 3:
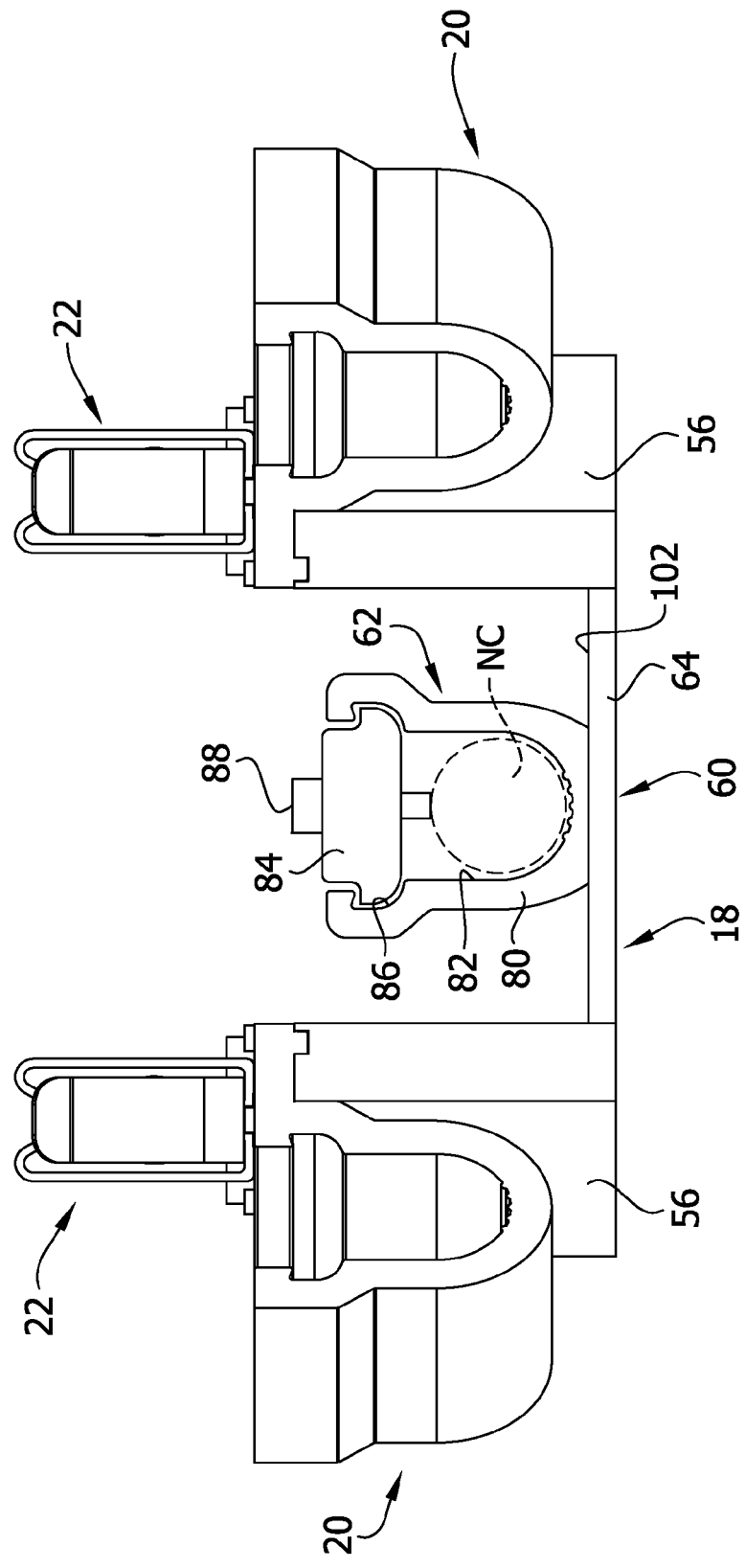
FIG. 3 is a side elevation of the meter socket subassemblies and the neutral-ground subassembly.
Figure 4:
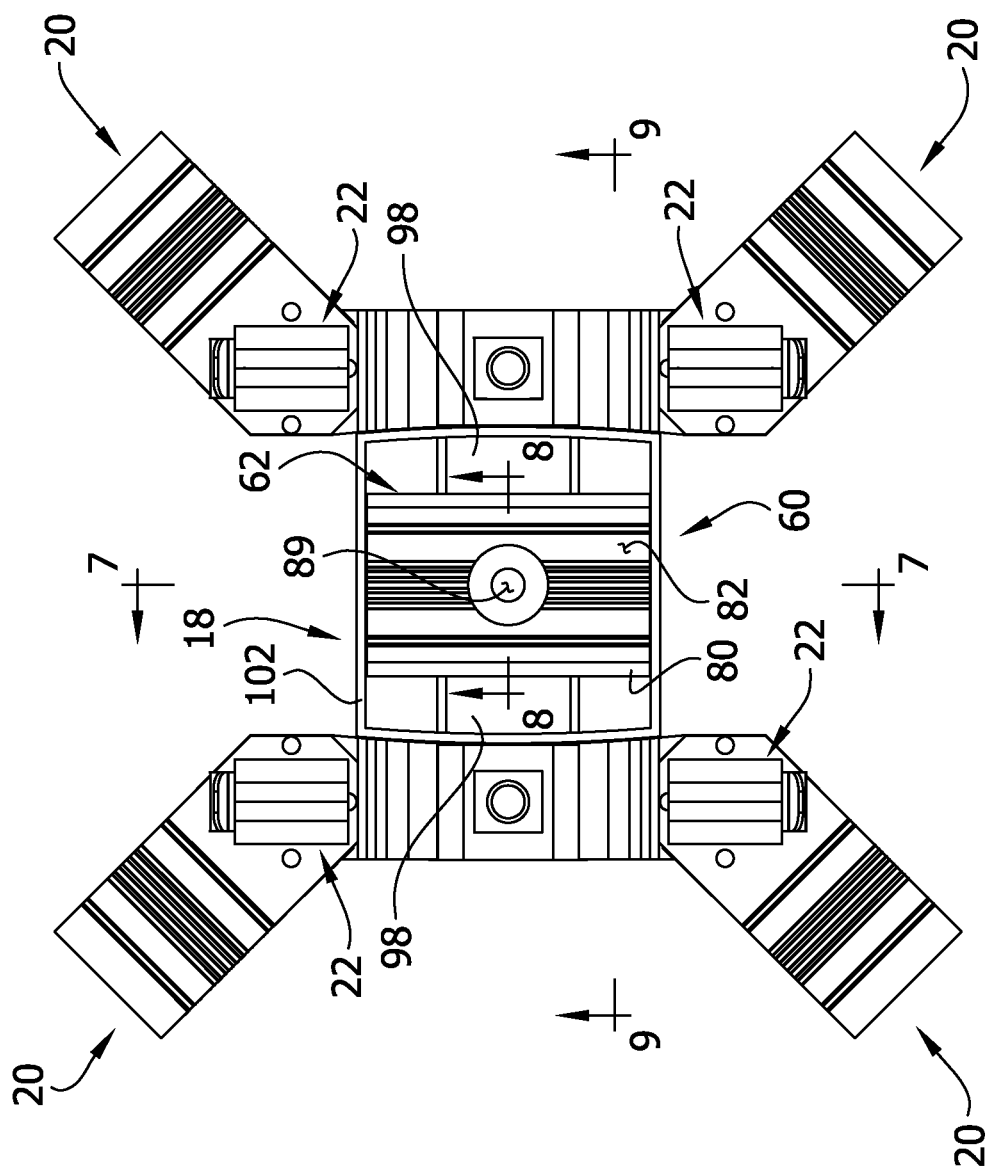
FIG. 4 is a front elevation of the meter socket subassemblies and the neutral-ground subassembly.

Referring to FIGS. 2 and 3, the neutral-ground subassembly 18 includes a neutral-ground support, generally indicated at 60, and a neutral-ground terminal, generally indicated at 62, mounted on the neutral-ground support. Referring to FIGS. 6A and 6B, the neutral-ground support 60 includes an electrically non-conductive body 64, which in the illustrated embodiment is generally in the shape of a plate or tray. The entirety of the support body 64 may be electrically non-conductive or at least a portion thereof is electrically non-conductive such that the body electrically isolates or insulates the neutral-ground terminal 62 from the remainder of the electric meter socket assembly 10 and from ground. In other words, the support body 64 does not electrically connect the neutral-ground terminal to the enclosure 12 or the meter socket subassembly 14 or ground. The support body 64 has a front mounting surface 66a (FIG. 6A) on which the neutral-ground terminal 62 is supported, and a rear surface 66b (FIG. 6B) that contacts the enclosure wall 16 (e.g., the back wall of the enclosure). As explained below, the support body 64 defines a lead conductor opening 70 (see also FIG. 5) extending through the front and rear surfaces 66a, 66b, respectively. In one example, the support body 64 may be formed from a rigid plastic material, such as a glass-filled polyester.

Figure 5:
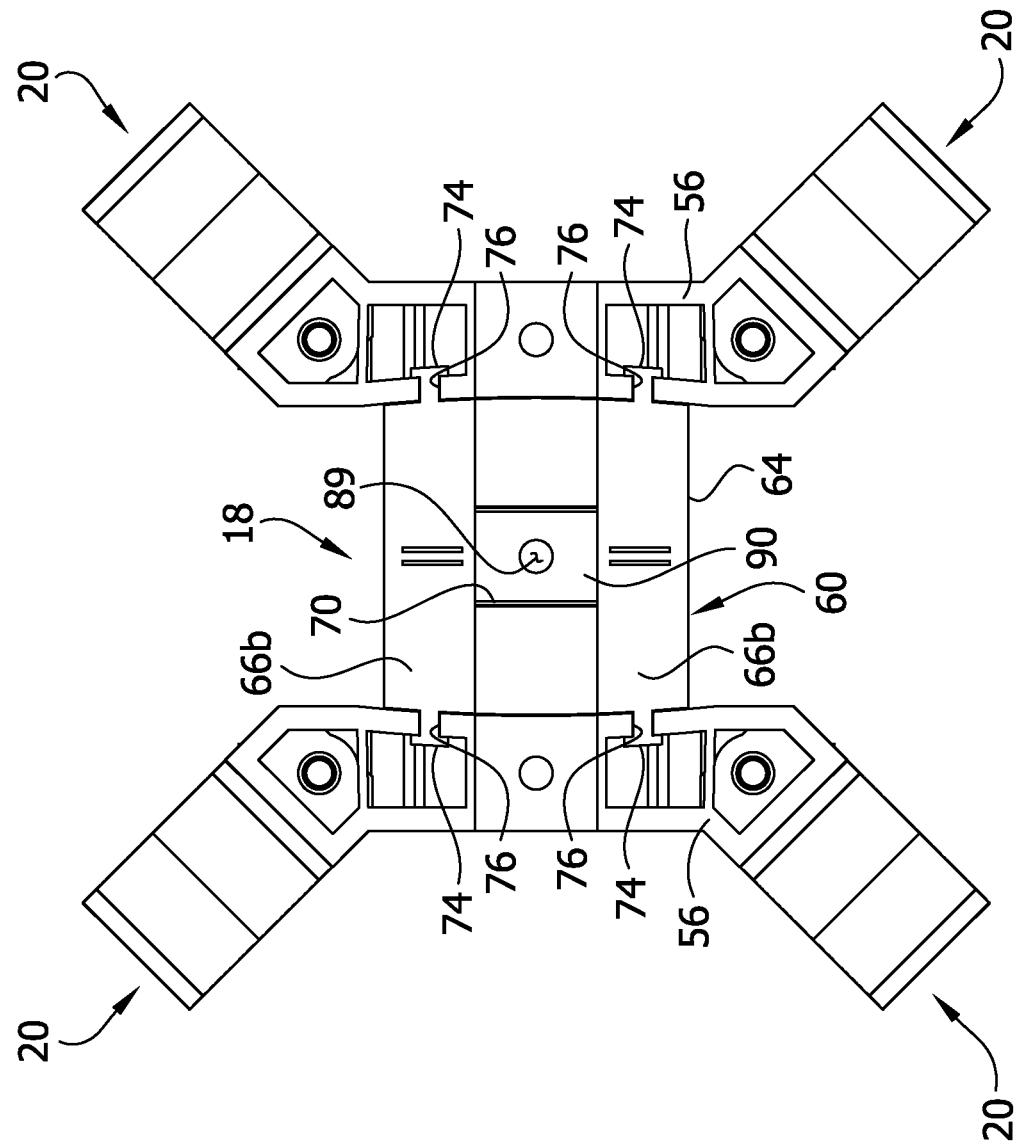
FIG. 5 is a rear elevation of the meter socket subassemblies and the neutral-ground subassembly.
Figure 6B:
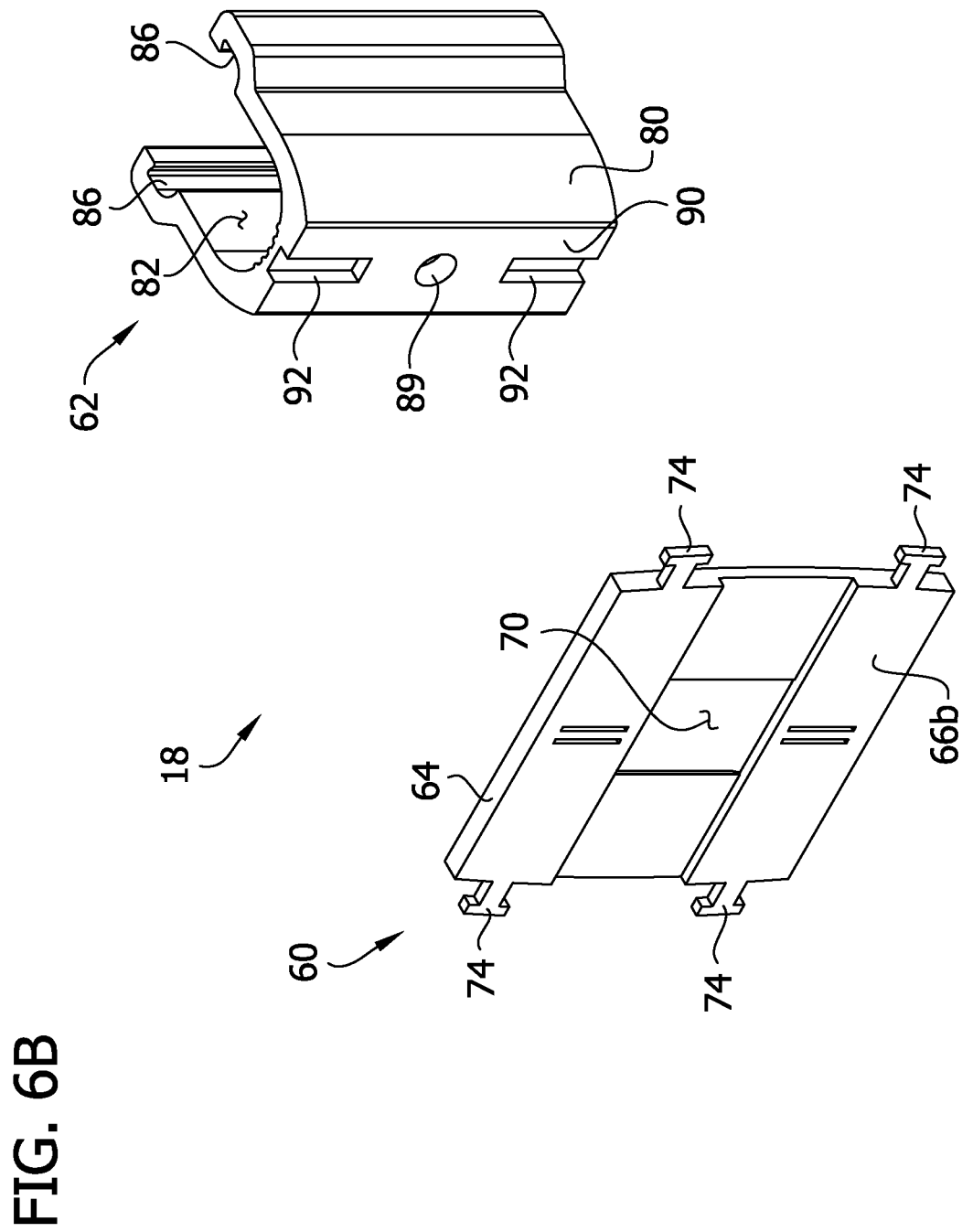
FIG. 6B is an exploded rear perspective of the neutral-ground subassembly.

Referring to FIG. 5, the support body 64 is connected to each of the two bases 56 of the meter socket subassembly 14 by base-connecting members 74 extending laterally outward from respective sides of the support body. The base-connecting members 74 are received in respective connector receptacles 76 at rear portions of the corresponding bases 56. The connector receptacles 76 comprise notches in the rear portions of the bases 56. In the illustrated embodiment, the base-connecting members 74 are configured to inhibit disengagement with the bases 56. For example, the illustrated base-connecting members 74 (also shown in FIGS. 6A and 6B) are generally T-shaped, although the connectors may be other shapes. With the bases 56 fastened to the enclosure wall 16 (e.g., the back wall), the base-connecting members 74 are captured in the respective connector receptacles 76 such that the neutral-ground subassembly 18 is fixedly secured to the meter socket subassemblies 14. In turn, the neutral-ground subassembly 18 is fixedly secured to enclosure 12 without the use of a fastener securing the neutral-ground subassembly to the enclosure. In another embodiment, the support body 64 may be integrally formed with the bases 56 or connected to the bases in other ways.

Figure 8:
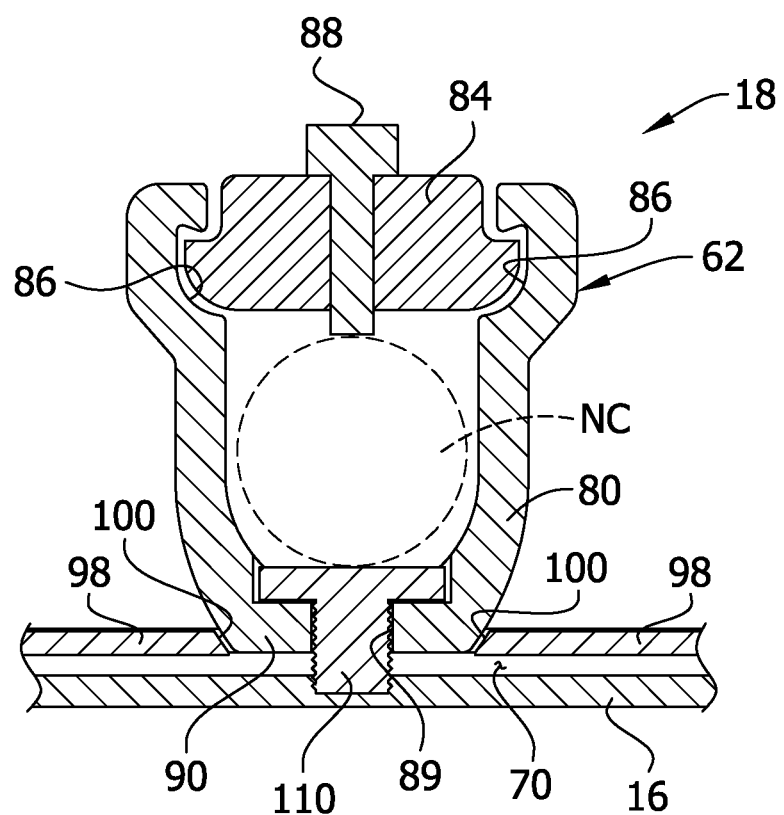
FIG. 8 is a cross section taken through the line 8-8 in FIG. 4, additionally including a fastener securing a neutral-ground terminal of the neutral-ground subassembly to a back wall of the enclosure and a cap secured to the neutral-ground terminal and securing a neutral conductor to the neutral-ground terminal.
Figure 9:
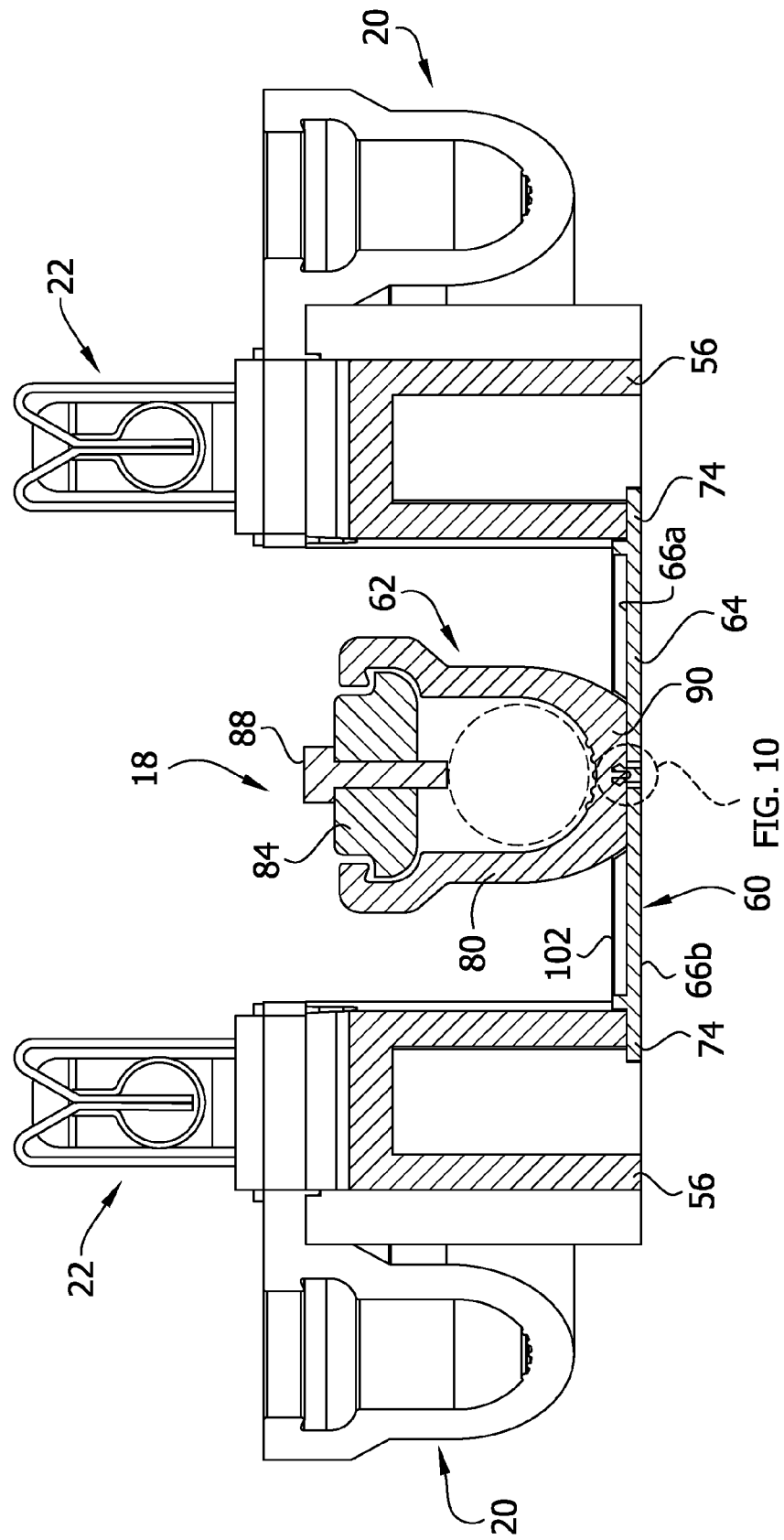
FIG. 9 is a cross section taken through the line 9-9 in FIG. 4, additionally including a fastener securing a neutral-ground terminal of the neutral-ground subassembly to a back wall of the enclosure and a cap secured to the neutral-ground terminal and securing a neutral conductor to the neutral-ground terminal.

Referring to FIGS. 3, 6A, and 6B, the illustrated neutral-ground terminal 62 includes an electrically conductive terminal body 80 defining an opening 82 (e.g., a channel-shaped opening) in which a neutral line or conductor NC is securable. The terminal body 80 is generally U-shaped in cross section (see FIG. 8) such that the neutral conductor NC is insertable into the opening 82 through an open portion of the terminal body. As shown in FIGS. 3, 8, and 9, a cap 84 is slidably received in a track 86 defined by the open portion of the terminal body 80. The neutral conductor NC is securable in the channel 82 using a fastener 88 (e.g., set screw) threaded in the cap 84 to both electrically and mechanically connect the neutral conductor to the terminal body 80. It is understood that the neutral-ground terminal 62 may be of other configurations without departing from the scope of the present invention. For example, the terminal body 80 may be other than U-shaped and may have an opening other than a channel-shaped opening for receiving the neutral conductor. For reasons explained below, the neutral-ground terminal 62 has a lead conductor opening 89, extending through a rear 90 of the terminal body 80, that is alignable with the lead conductor opening 70 in the support body 64.

Figure 10:
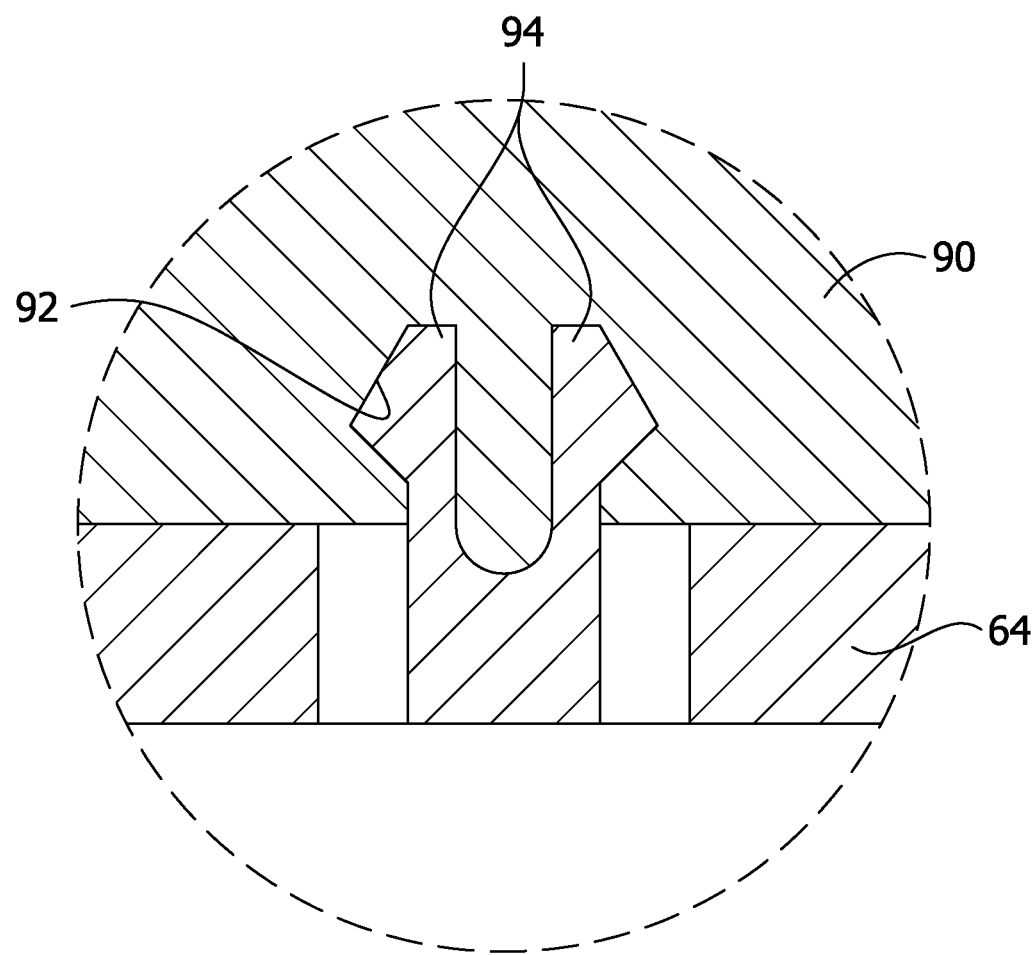
FIG. 10 is an enlarged view of a connection between the neutral-ground terminal and a neutral-ground support in FIG. 9.

Referring to FIGS. 6A and 6B, the neutral-ground terminal 62 is attached to (e.g., mounted on) the neutral-ground support 60 by mateable terminal and support connectors 92, 94, respectively, of the respective neutral-ground terminal and the neutral-ground support. The illustrated terminal connector 92 is at the rear 90 of the terminal body 80, and in the illustrated embodiment, the terminal connector comprises a female snap-fit connector (e.g., two spaced-apart slot shaped opening extending along the rear of the terminal body). The illustrated support connector 94 is at the front mounting surface 66a of the support body 64, and, in the illustrated embodiment (FIG. 10), the support connector comprises a male snap-fit connector (e.g., a pair of spaced apart snap-fit arms or prongs) configured for snap-fit insertion in the female snap-fit connector 92 of the neutral-ground terminal 62. In the illustrated embodiment, the connectors 92, 94 are configured for permanent or non-releasable connection, although the connectors may be configured for releasable connection to one another. The male and female connectors 92, 94 can be reversed.

Figure 7:
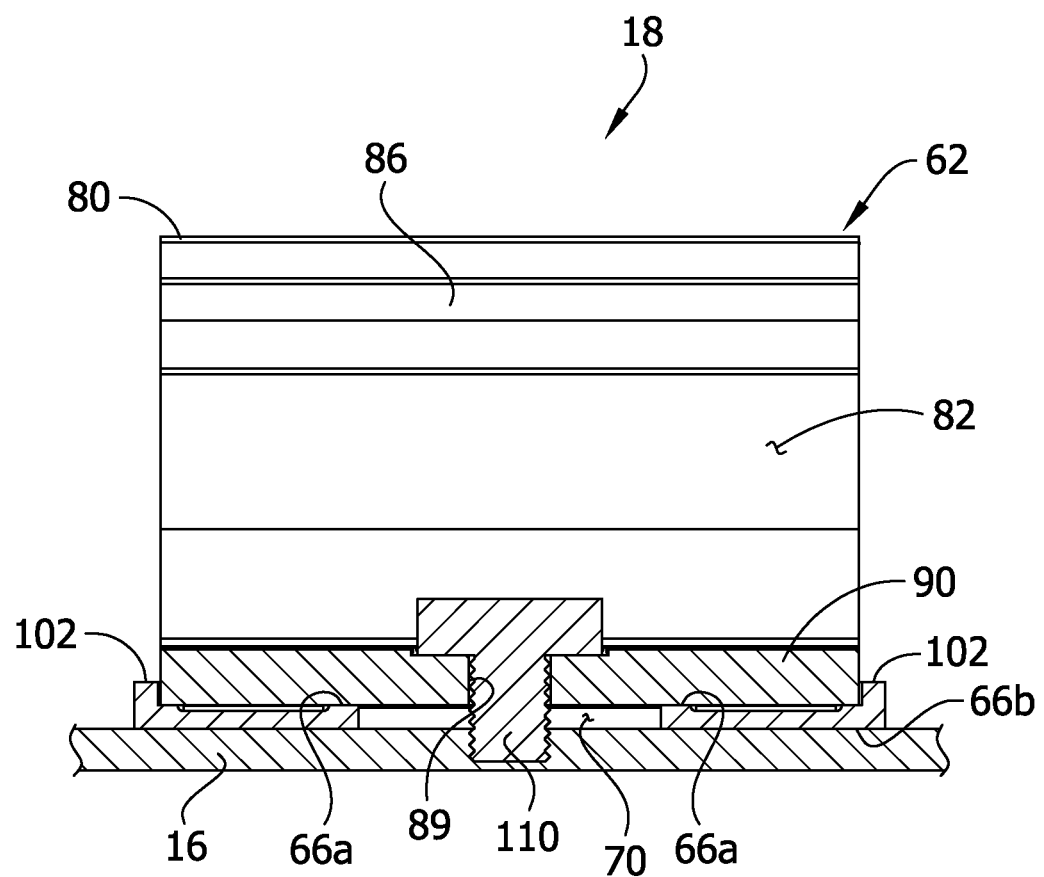
FIG. 7 is a cross section taken through the line 7-7 in FIG. 4, additionally including a fastener securing a neutral-ground terminal of the neutral-ground subassembly to a back wall of the enclosure.

A pair of guides 98 extend forward from the mounting surface 66a of the support body 64 on opposite sides of the lead conductor opening 70. As illustrated in FIG. 8, inner surfaces 100 of the respective guides 98 are beveled or chamfered toward the lead conductor opening 70 for guiding and properly aligning the neutral-ground terminal body 80 on the neutral-ground support 60 such that the respective snap-fit connectors 92, 94 are brought into engagement when the neutral-ground terminal is lowered onto the support. As shown in FIGS. 6A and 7, the support body 64 also includes a rim 102 on the mounting surface 66a and extending at least partially about a perimeter of the body. Together, the guides 98 and at least a portion of the rim 102 capture the rear 90 of the neutral-ground terminal 62 to further support the neutral-ground terminal. In other embodiments, the neutral-ground terminal 62 may be attached to the neutral-ground support 60 in other ways.

As shown best in FIG. 7, the lead conductor openings 70, 89 in the respective neutral-ground support 60 and neutral-ground terminal 62 are generally aligned such that a lead conductor 110 is removably insertable through the aligned openings for grounding the neutral-ground support. In particular, in the illustrated embodiment the lead conductor 110 comprises an electrically conductive fastener (e.g., a screw or bolt) extending through the lead conductor openings 70, 89 and secured (e.g., threaded) into the enclosure wall 16 (e.g., the back wall). A head of the illustrated fastener 110 engages the rear 90 in the opening 82 of the terminal body 80. Accordingly, the illustrated lead conductor 110 both electrically connects the neutral-ground terminal 62 to the enclosure wall 16 (and thus ground) and mechanically fastens the neutral-ground terminal (and the neutral-ground support 60) to the enclosure wall.

As can be understood from the above disclosure, in the illustrated embodiment the neutral-ground terminal 62 is attachable to the neutral-ground support 60 without use of an additional fastener, such as the lead conductor 110. When the lead conductor 110 is not fastened to the enclosure 12 (e.g., when the lead conductor is removed or omitted from the meter socket assembly 10), the neutral-ground terminal 62 and the neutral conductor NC are electrically isolated or insulated from ground (i.e., the neutral-ground terminal 62 and the neutral conductor NC are ungrounded). To electrically connect the neutral-ground terminal 62 (and the neutral conductor NC) to ground, the lead conductor 110 is inserted through the aligned lead conductor openings 70, 89 and fastened to the enclosure 12 (e.g., the back wall 16). Thus, the above-disclosed meter socket assembly 10 allows a user to choose whether to electrically ground the neutral conductor NC or to electrically isolate the neutral conductor from ground.

Having described the invention in detail, it will be apparent that modifications and variations are possible without departing from the scope of the invention defined in the appended claims.

When introducing elements of the present invention or the preferred embodiments(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above constructions, products, and methods without departing from the scope of the invention, it is intended that all matter contained in the above description and shown in the accompanying drawings shall be interpreted as illustrative and not in a limiting sense.

What is claimed is:

1. An electric meter socket assembly comprising:
    a neutral-ground support including a support body having a mounting surface, and a support connector at the mounting surface of the body; and
    a neutral-ground terminal including
        a terminal body having a rear, and an opening for receiving a neutral conductor, and
        a terminal connector at the rear of the terminal body configured to mate with the support connector such that the neutral-ground terminal is attachable to the neutral-ground support without use of a separate fastener,
    wherein the neutral-ground terminal has a first lead conductor opening extending through its rear, and wherein the neutral-ground support has a second lead conductor opening extending through the support body, wherein the first and second lead conductor openings are generally alignable and configured to receive a lead conductor therein when the neutral-ground terminal is attached to the neutral-ground support for electrically connecting the neutral-ground terminal to ground.

2. The electric meter socket assembly set forth in claim 1, further comprising:
    an enclosure in which the neutral-ground support and the neutral-ground terminal are secured;
    a lead conductor comprising an electrically conductive fastener configured for reception in the first and second lead conductor openings when the neutral-ground terminal is attached to the neutral-ground support to electrically connect the neutral-ground terminal to the enclosure.

3. The electric meter socket assembly set forth in claim 1, wherein the support connector comprises a pair of spaced apart support connectors, wherein the second lead conductor opening is disposed between the pair of spaced apart terminal connectors.

4. The electric meter socket assembly set forth in claim 1, wherein the support connector and the terminal connector comprise mateable snap-fit connectors.

5. The electric meter socket assembly set forth in claim 4, wherein the support connector comprises a male snap-fit connector, and wherein the terminal connector comprises a female snap-fit connector.

6. The electric meter socket assembly set forth in claim 4, wherein the support body has a pair of guides at the mounting surface for guiding the neutral-ground terminal into mating connection with the neutral-ground support.

7. The electric meter socket assembly set forth in claim 1, wherein the support body includes a base-connecting member for connecting the neutral-ground support to an electrically non-conductive base of the electric meter socket assembly.

8. The electric meter socket assembly set forth in claim 7, further comprising:
    an electrically non-conductive base having front and rear portions;
    a power line terminal mounted on the front portion of the base; and
    a female electrical contact electrically connected to the power line terminal and defining a slot for receiving a male electrical contact of an electric meter to electrically connect to the electric meter,
    wherein the base has a connector receptacle at the rear portion thereof, and wherein the base-connecting member of the neutral-ground support extends outward from the support body and is received in the connector receptacle of the base for connecting the neutral-ground support to the base.

9. The electric meter socket assembly set forth in claim 8, further comprising an enclosure, wherein the base is fastened to the enclosure, wherein the neutral-ground support is held in place in the enclosure by the base.

10. An electric meter socket assembly comprising:
    a neutral-ground terminal including a terminal body having a rear, a neutral conductor opening for receiving a neutral conductor, and a first lead conductor opening extending through the terminal body, and
    a neutral-ground support including a support body having a terminal mounting surface, and a second lead conductor opening extending through the support body,
    wherein the neutral-ground terminal is mounted on the support body,
    wherein at least a portion of the neutral-ground support is electrically non-conductive such that the neutral-ground support electrically isolates the neutral-ground terminal to selectively inhibit electrical connection of the neutral-ground terminal to ground, wherein the first and second lead conductor openings are generally aligned and configured to receive a lead conductor therethrough for selectively electrically connecting the neutral-ground terminal to ground.

11. The electric meter socket assembly set forth in claim 10, further comprising a lead conductor extending through the first and second lead conductor openings for electrically connecting the neutral-ground terminal to ground.

12. The electric meter socket assembly set forth in claim 11, further comprising an enclosure in which the neutral-ground terminal and the neutral-ground support are secured, wherein the lead conductor electrically connects the neutral-ground terminal to the enclosure.

13. The electric meter socket assembly set forth in claim 12, wherein the lead conductor comprises an electrically conductive fastener, wherein the fastener is removably fastened to the enclosure.

14. The electric meter socket assembly set forth in claim 10, wherein the neutral-ground support includes a support connector on the terminal mounting surface, and wherein the neutral-ground terminal includes a terminal connector at the rear of the terminal body, the first and second connectors being mated such that the neutral-ground terminal is attached to the neutral-ground support without use of a separate fastener or the lead conductor.

15. The electric meter socket assembly set forth in claim 14, wherein the support connector and the terminal connector comprise snap-fit connectors.

16. The electric meter socket assembly set forth in claim 15, wherein the support connector comprises a male snap-fit connector, and wherein the terminal connector comprises a female snap-fit connector.

17. The electric meter socket assembly set forth in claim 15, wherein the support connector comprises a pair of spaced apart support connectors, wherein the second lead conductor opening is disposed between the pair of spaced apart terminal connectors.

18. The electric meter socket assembly set forth in claim 15, wherein the support body has a pair of guides at the mounting surface for guiding the neutral-ground terminal into mating connection with the neutral-ground support.

19. An electric meter socket assembly comprising:
a neutral-ground support including a support body having a mounting surface, and a support connector at the mounting surface of the body; and
a neutral-ground terminal including
a terminal body having a rear, and an opening for receiving a neutral conductor, and
a terminal connector at the rear of the terminal body configured to mate with the support connector such that the neutral-ground terminal is attachable to the neutral-ground support without use of a separate fastener;
an electrically non-conductive base having front and rear portions;
a power line terminal mounted on the front portion of the base; and
a female electrical contact electrically connected to the power line terminal and defining a slot for receiving a male electrical contact of an electric meter to electrically connect to the electric meter,
wherein the support body includes a base-connecting member for connecting the neutral-ground support to an electrically non-conductive base of the electric meter socket assembly,
wherein the base has a connector receptacle at the rear portion thereof,
wherein the base-connecting member of the neutral-ground support extends outward from the support body and is received in the connector receptacle of the base for connecting the neutral-ground support to the base.

20. The electric meter socket assembly set forth in claim 19, wherein the support connector and the terminal connector comprise mateable snap-fit connectors.

\* \* \* \* \*